United States Patent [19]

Goodhue

[11] Patent Number: 4,855,255
[45] Date of Patent: Aug. 8, 1989

[54] TAPERED LASER OR WAVEGUIDE OPTOELECTRONIC METHOD

[75] Inventor: William D. Goodhue, Chelmsford, Mass.

[73] Assignee: Massachusetts Institute of Technology, Cambridge, Mass.

[21] Appl. No.: 171,952

[22] Filed: Mar. 23, 1988

[51] Int. Cl.$^4$ ............... H01L 21/18; H01L 7/34; H01L 3/19
[52] U.S. Cl. .................... 437/129; 437/107; 437/138; 437/145; 357/16; 357/17; 372/43; 372/50
[58] Field of Search ............ 437/23, 107, 117, 128, 437/129, 130, 135, 138, 145, 247, 95; 357/16, 17; 372/43, 44, 50

[56] References Cited

U.S. PATENT DOCUMENTS

| | | | |
|---|---|---|---|
| 3,533,862 | 10/1970 | Gleim et al. | 437/95 |
| 3,751,310 | 8/1973 | Cho | 437/129 |
| 4,255,717 | 3/1981 | Scifres et al. | 331/94.5 |
| 4,637,122 | 1/1987 | Carney et al. | 437/127 |
| 4,718,070 | 1/1988 | Liau et al. | 372/50 |

OTHER PUBLICATIONS

Silicon Processing for VLSI ERA, 1986 by Wolf & Tauber p. 157, Growth of MBE Silicon.
Goodhue et al., in *Institute of Physics Conference Series* 83, W. T. Lindley ed., IOP Publishing Ltd., Bristol, pp. 349–354 (1987).
Welch et al., *Appl. Phys. Lett.*, 49:1632–1634 (1986).
Murakami et al., *IEEE J. Quantum Elec.*, QE-23:7-12-719 (1987).
Coburn and Winters, *J. Vac. Sci. Tech.* 16:1613–1614 (1979).
Lechmann and Widmer, *J. Vac. Sci. Tech.*, 15:319–326 (1978).
Marcuse, *Bell System Tech. J.*, Feb.:273–290 (1970).
Kraus, in *Antennas*, McGraw-Hill Electrical and Electronic Engineering Series, F. E. Terman (ed.), McGraw-Hill, New York, pp. 404–407 (1950).
Goodhue, et al., Solid State Research Report, Lincoln Laboratory, MIT, 3:26–31 (Jan. 19, 1988).
Kapon et al., *Appl. Phys. Lett.*, 50:347 (1987).
Ralston et al., *J. Vac. Sci. Tech.*, B4:594 (1986).
Van Hove et al., *J. Vac. Sci. Tech.*, B3:1116 (1985).
Iwata et al., *Jpn. J. Appl. Phys.*, 24:L17 (1985).
Suchoski et al., *J. Lightwave Tech.* LT-5:1246–1251 (1987).
Mueller and Tyrrell, *Bell System Tech. J.*, 26:837–851 (1947).
Tsang and Cho, *Appl. Phys. Lett.*, 30:293 (1977).
Nagata et al., *Appl. Phys. Lett.*, 30:503 (1977).
Smith et al., *Appl. Phys. Lett.*, 47:712 (1985).

*Primary Examiner*—Brian E. Hearn
*Assistant Examiner*—Tuan Nguyen
*Attorney, Agent, or Firm*—Hamilton, Brook, Smith & Reynolds

[57] ABSTRACT

A method and apparatus for forming tapered thickness and material content of III–V material, or alloys thereof, in particular GaAs and AlGaAs, by gradient thermal heating of substrates during epitaxial growth and the optoelectronic structures formed thereby.

12 Claims, 7 Drawing Sheets

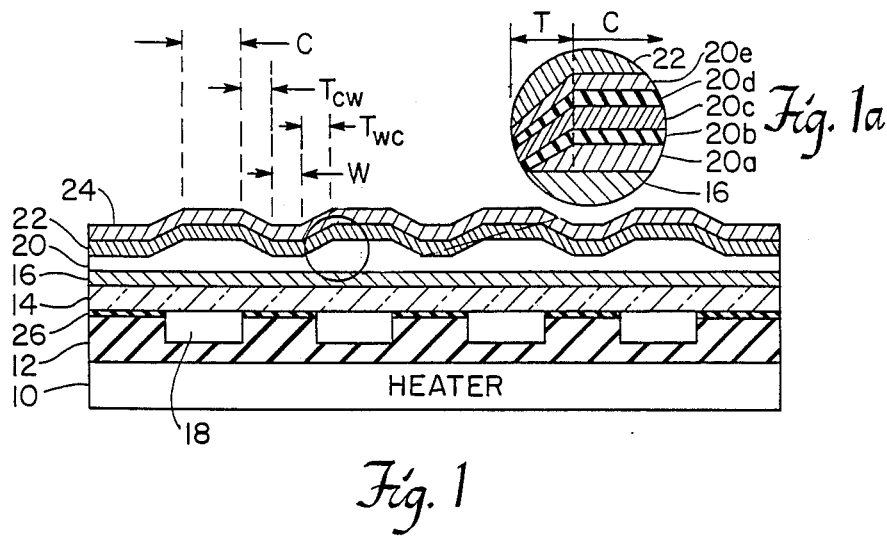
Fig. 1
Fig. 1a
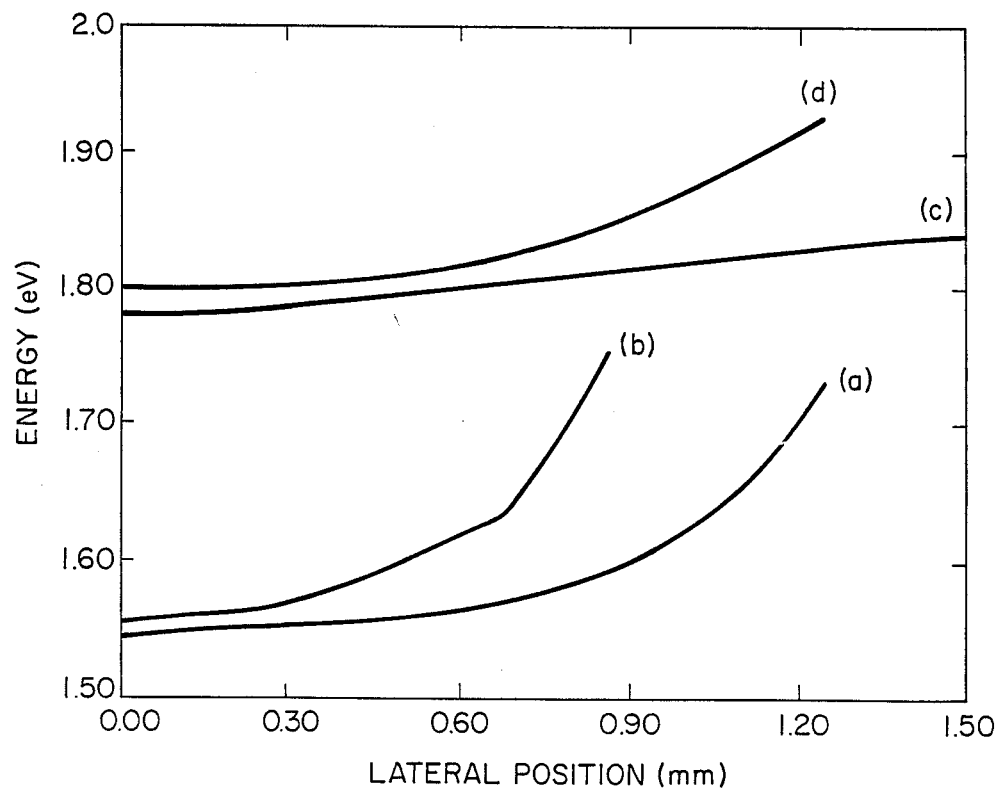
Fig. 3

TAPERED LASER OR WAVEGUIDE OPTOELECTRONIC METHOD

GOVERNMENT RIGHTS

The U. S. Government has rights in this invention pursuant to U.S. Air Force Contract No. F19628-85-C-0002.

BACKGROUND ART

Molecular Beam Epitaxy (MBE) is a vacuum evaporation technique in which effusion cells containing elemental sources are used to generate molecular beam fluxes for ultra high vacuum, in situ, epitaxial growth of crystalline structures on uniformly heated substrates. Metals, semiconductors and insulators can be grown by MBE.

Of particular interest to researchers and developers, because of their excellent optoelectronic properties, is the epitaxial growth of III-V compounds and alloys thereof and, more specifically, GaAs and AlGaAs. Note that reference will be made hereafter to III-V materials in general but the invention will be described using the IIIA series of elements, i.e. Boron, Aluminum, Gallium, Indium and Thallium and, in particular, Gallium, as the III material; while the alloys of the III-V compound will refer principally to the aluminum alloy of GaAs or GaInAs.

Typical MBE systems include a high vacuum growth chamber in which a plurality of effusion cells are disposed. Each cell consists of a pyrolitic boron nitride crucible in which a charge of the element, and/or dopant to be deposited, is stored. Each crucible is heated by a furnace and has a shutter located in front of it to physically interrupt the beam flux. Adjacent cells are isolated from each other by cryopanels.

Instrumentation, such as reflection high-energy-electron diffraction (RHEED) equipment, is employed for in situ characterization of the structure during growth.

MBE routinely achieves abrupt heterointerfaces, precise thickness and doping control, which is essential for fabrication of a variety of semiconductor structures. Such structures include, for example, selectively doped heterostructure transistors (SDHT's) in which doping of heterostructures is modulated to spatially separate conduction electrons and their parent donor impurity atoms. Another example of MBE applications is the fabrication of superlattices or quantum-well structures consisting of alternate epitaxial layers of thin (5-40 nm) low band gap (GaAs) and high band gap ($Al_xGa_{1-x}As$) materials. The abrupt steps in the energy gaps of the superlattices form potential wells in the conduction and valence bands. In the GaAs layers, the motion of the carriers is restricted in the direction perpendicular to the heterojunction interfaces, while they are free to move in the other two directions. The carriers (electrons, in this case) can therefore be considered as a two dimensional gas, sometimes referred to as a 2DEG.

Quantum well heterostructures exhibit more efficient luminescence intensities than bulk crystal heterostructures and have therefore been incorporated into the active region of laser devices.

Processes for growing quantum wells of III-V compound alloys with thicknesses and alloy content that vary across the substrate surface in a controlled manner, are not presently available. The ability to grow planar epitaxial layers of III-V alloys with regions of differing and controllable thicknesses and alloy content across a wafer would enable fabrication of a number of new or improved devices. These include the monolithic integration of lasers of different frequencies, high electron mobility transistors with tapered quantum wells, new waveguide devices, and improvement in spatial light modulators which use the excitonic Stark effect of quantum wells.

Tapered quantum wells in the GaAs/AlGaAs system have been achieved by growing upon substrates in which grooves have been etched [W. T. Tsang and A. Y. Cho, *Appl. Phys. Lett.* 30, 293 (1977); S. Nagata, T. Tanaka and M. Fukai, ti Appli. Phys. Lett. 30, 503 (1977); J. S. Smith, P. L. Derry, S. Margalit and A. Yariv, *Appl. Phys. Lett.* 47, 712 (1985); E. Kapon, M. C Tamargo and D. M. Hwang, *Appl. Phys. Lett.* 50, 347 (1987)], thereby relying on the growth rate differences between various crystallographic planes. This etched-groove process achieves tapering of layer thickness at the expense of planarity and creates thickness variations only at the edges and sidewalls of the grooves.

Other semiconductor growth processes, such as chemical vapor deposition (CVD); organo metallic CVD (OMCVD); and now recently chemical beam epitaxy (CBE), involve growth by deposition of III-V reactants on uniformly heated substrates. Such processes would also benefit from the ability to vary the thickness of the deposit and content of the III material in regions of the substrate. Accordingly, a long felt, heretofore unsatisfied, need has existed for a simple process of growing III-V compounds or alloys thereof on a substrate with regions of controlled thickness and alloy content.

DISCLOSURE OF THE INVENTION

In accordance with the present invention, instead of uniformly heating the substrate during the growth process of III-V material or alloys thereof, a temperature gradient is formed adjacent a region of the substrate during the growth process. Researchers have found that in the case of the III material gallium, the sticking coefficient, i.e. the number of Ga atoms which remain on the wafer surface to be incorporated into the crystal (substrate) dramatically decreases with substrate temperatures higher than 700° C. [See J. Ralston, G. W. Wicks and L. F. Eastman, *J. Vac. Sci. Technol.* B4, 594 (1986) and J. M. Van Hove, P. R. Pokite, G. J. Shaley, A. M. Wowchak and P. I. Cohen, *J. Vac. Sci. Technol.* B3, 1116 (1985)]. The sticking coefficient is defined as the ratio of the number of atoms incorporated per unit time into the crystal to the number of atoms impinging on the surface of the crystal. In GaAs structures or AlGaAs structures grown above 700° C., the thickness of the GaAs layers and AlGaAs layers respectively decreases as temperature increases. In addition, the loss of gallium in the AlGaAs layers causes a corresponding increase in the fraction of AlAs and a consequent increase in the band gap of the AlGaAs layers. Similar effects have also been observed by the present inventor in other type III semiconductor materials such as In.

BRIEF DESCRIPTION OF THE DRAWINGS

FIG. 1 is a schematicized cross sectional view of a system of growing GaAs/AlGaAs layers with varying Al content and thickness in accordance with the invention.

FIG. 1a is an enlarged view of FIG. 1 showing the details of the active layers 20 of FIG. 1.

FIG. 3 is a plot of energy versus lateral position on samples made in accordance with the invention.

BEST MODE OF CARRYING OUT THE INVENTION

Figure 2:
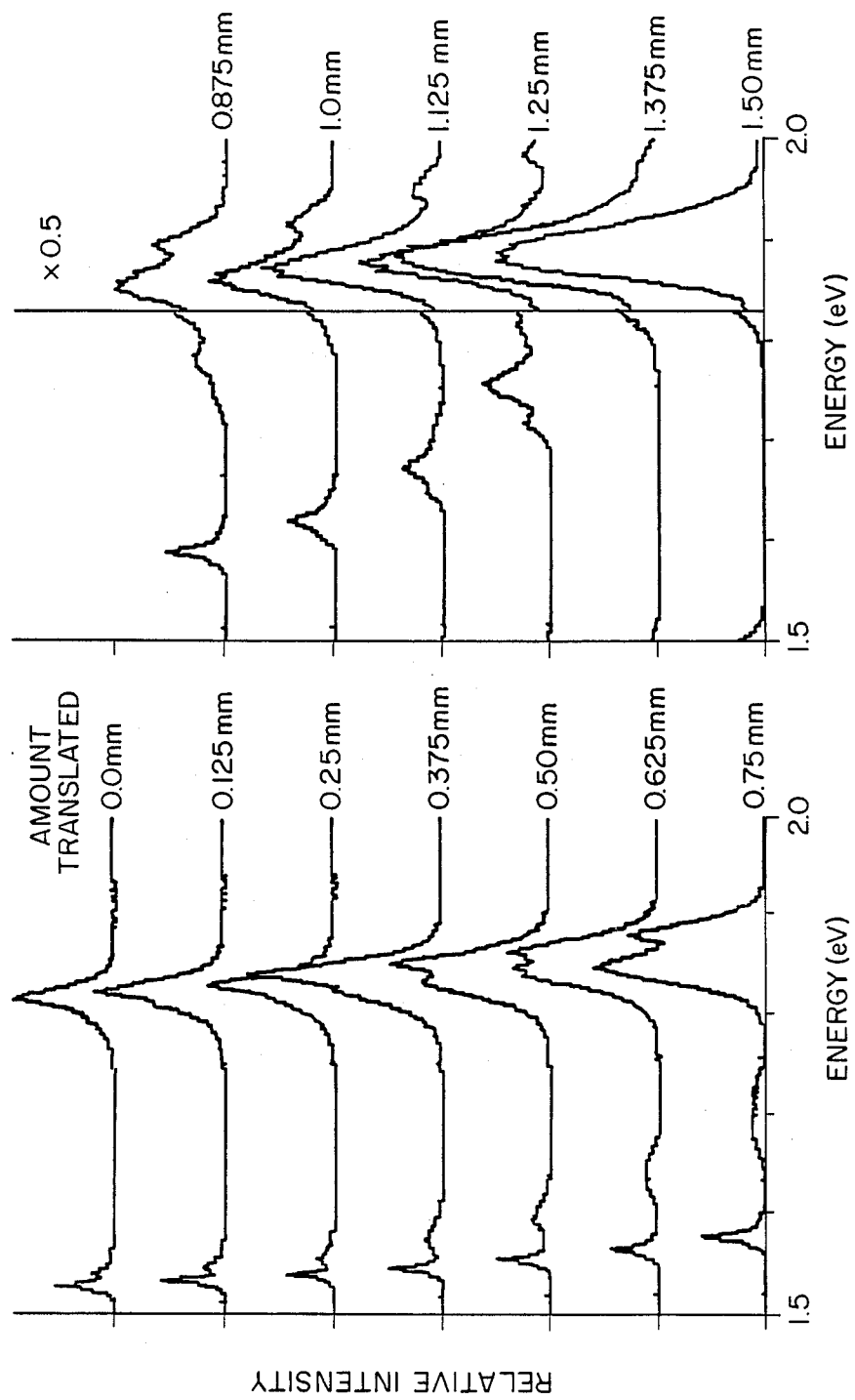
FIG. 2 is a plot of relative intensity versus energy at various substrate locations indicated in FIG. 3.

I. General Description Of Method And Experimental Data

Referring now to FIGS. 1 and 1a, the invention will now be illustrated in connection with an MBE method for growing GaAs/AlGaAs quantum-well samples on an n$^-$ GaAs substrate 14.

The GaAs/AlGaAs quantum-well samples consist of an MOCVD AlGaAs buffer layer 16, an active section 20 consisting of a number of GaAs quantum-wells 20a, 20c and 20e separated by AlGaAs barriers 20b and 20d an AlGaAs cladding layer 22 and a GaAs cap layer 24, all of which (except for layer 16) are grown by MBE on a (100)- oriented n$^+$-GaAs substrate 14. The substrate 14 is mounted with indium bonding 26 on a slotted MBE mounting block 12 made of molybdenum. As shown in FIG. 1, the mounting block 12 sits on a graphite MBE heater 10 in a reaction chamber (not shown). The slots 18 are laterally spaced along the block in the regions where the cooler substrate temperature is desired. With the block temperature set at 710° to 720° C., using the appropriate controller (not shown) of the MBE system, the surface temperature of the region of the GaAs substrate 14 mounted over the recesses 18 in the mounting block, as measured by a two-color infrared pyrometer (also not shown), is 30° to 50° C. colder than the surface over the indium-bonded regions. Other methods for varying the substrate surface temperature, such as composite substrate blocks and/or oxides, metals, or etched grooves on the substrate backside, could also be employed as well as patterned optical heating from the front side with lamps or lasers. The substrates are overgrown in the MBE system at block temperatures in the range of 705°–715° C. using an ion gauge arsenic flux of $1.5 \times 10^{-5}$ Torr, and arsenic-to-gallium flux ration of 24 to 1, and a gallium-to-aluminum flux ration of 5 to 1. The shutters are timed to give a nominal 12-nm-thick GaAs quantum well width for layers 20a, 20c and 20e.

Using the apparatus shown in FIG. 1, quantum-well GaAs layers 20a, 20c and 20e and AlGaAs layers 20b and 20d may be grown in the colder regions, labelled C, which are thicker, and in which the Ga content of the AlGaAs layers is less than in corresponding adjacent warmer regions, labelled W. Note that in FIG. 1, the layers 20 are grown using the gradient heating block while layers 22 and 24 can be either grown conventionally or with graded heating. The optional MOCVD buffer layer is grown only as an experimental convenience and is not required to implement the technique. In the test samples described below, with the 200 meV shift, all layers above the MOCVD buffer layer 16 were grown using the gradient heating system. Between the two regions C & W, a cold-to-warm transition region Tcw exists. Between the two regions W and C a warm-to-cold transition region Twc exists. In the Twc region, the thickness of the layers and the Ga content of the layer gradually increases; whereas in the Tcw region both the thickness and Ga content tapers off or gradually decreases. The loss of Ga content in the AlGaAs layers of the Tcw region causes an increase in the fraction of AlAs content and a consequent gradual increase in the barrier height of the AlGaAs layers in the Tcw region. In the C region, the barrier height is lowest and is a constant while the barrier thickness is greatest. The layers in the colder region with thick barriers behave as uncoupled wells whereas they make a continuous transition in the Tcw to a coupled or superlattice configuration with thin barriers in the hotter region W.

Photoluminescence data at 77K from typical samples, made as described above, show spatially dependent energies of the quantum-well excitons which correlate with the local temperature of the substrate during the growth process. Depending on the temperature of the substrate block, the differences in exciton peak energies between the cooler regions over the recesses in the mounting block and the warmer regions over the indium bond are from 20 meV. Strong luminescence is observed in the transition regions, as well as in the constant-temperature zones of the wafers. Transition regions are less than 2 mm wide.

The sample with the 200-meV shift in the exciton peak energies illustrates the power, as well as some of the limitations of this growth technique. In this sample, a 15 μm-thick AlGaAs buffer layer was grown by metalorganic chemical vapor deposition (MOCVD) on the sample before it was mounted and overgrown in the MBE system. The MOCVD layer was added to facilitate substrate removal for optical transmission studies. The MBE-grown layers were as described above, with the number of GaAs quantum-well layers such as 20c being equal to twelve. FIG. 2 shows a series of spectra taken across the transition region of the sample starting from the colder side. The peaks of FIG. 2 are plotted as a function of position in FIG. 3. The various regions of the wafer were identified by visual inspection of the interference pattern which formed on the wafer surface. The pattern shows the transition regions as regions of color change consistent with tapering. In the colder region (0.0–0.3 mm in FIG. 3), the heavy-hole peaks [trace (a) of FIG. 3] and light-hole peaks [trace (b) of FIG. 3] are clearly resolved. In the hotter region (1.0 mm and above in FIG. 3), the light-hole peak is lost and the heavy-hole peak merges with the underlying peak of the MOCVD AlGaAs buffer layer. Beyond about 0.7 mm in FIG. 3, the surface temperature of the substrate is above 700° C. and Al diffusion in the wells becomes significant [N. Iwata, Y. Matsumoto and T. Baba, *Jpn. J. Appl. Phys.* 24, L17 (1985)]. In this region, the slopes of both the light-hole and heavy-hole peak curves increase rapidly, indicating coupling of the wells; the quantum-well structure has become a superlattice alloy, approximately equivalent in average composition to the MOCVD AlGaAs buffer.

The photoluminescence data from the transition region indicates the temperature ranges where well thickness change and Al diffusion influence the layers. The tracks of the heavy-hole and light-hole data of FIG. 3 in the region between 0.0 and 0.7 mm, show that as the thickness of the wells varies, little Al diffusion occurs. The data obey the standard square-well model and the separation between the light-hole and heavy-hole peaks is in agreement with theory. Beyond 0.7 mm, the heavy-hold and light-hole peak separation is much larger than predicted by the square-well model, indicating that both a decrease in well thickness, as well as diffusion of Al into the wells, is occurring. The shift of the light-hole peak to higher energy is too rapid to be explained by thinner GaAs wells (irrespective of the change in the AlGaAs barriers). The peak is more likely due to the quantum-well confined states which move to higher energy and assume a miniband character because of diffusion of Al into the wells and thinning of the barriers. It is also interesting to note that the integrated intensity of the peaks of curve (b) increases toward the hotter region, which might indicate that relaxation from those states to the heavy-hole ground state has decreased. The line shapes of the (b) peaks, which move rapidly in the transition region, are quite possibly narrower toward the hotter region than the data indicates. Over the 50 μm spot size of the excitation laser, there is significant variation in the thickness and Al content of the layers.

The peaks plotted in trace (d) of FIG. 3 on the high-energy side of the MOCVD AlGaAs buffer peak [trace (c) of FIG. 3] are due to the AlGaAs cladding layers. These layers are also affected by substrate temperature. As the substrate temperature increases, the percentage of GaAs in the AlGaAs layers decreases, making the band gap of the layers larger. The barriers between the quantum wells are also affected in the same manner. As the heavy hole peak merges with the first AlGaAs peak, a variety of shoulders appears in the data. Presently, these shouldered are attributed to the formation of minibands.

A semi-quantitative analysis of the thicknesses of the layers is possible from the photoluminescence and MBE layer timing data. In this analysis, it is assumed that the AlAs growth rate is the same in both the hotter and colder regions and that the rate of incorporation of GaAs in AlGaAs layers is independent of AlAs percentage at a fixed temperature. The peak from the MBE-grown AlGaAs cladding layer in the colder region indicates that the MBE-grown AlGaAs layers in that region contain 20% AlAs. On the basis of square-well theory and 20% AlAs barriers, the quantum-well thicknesses in that region are 13 nm. From the MBE growth times, the growth rates of the GaAs and AlGaAs layers are inferred to be 0.21 nm s$^{-1}$ and 0.26 nm s$-1$, respectively, and the thickness of the barriers between the wells is determined to be 22 nm. In the hotter region, the AlGaAs cladding layers contain 40% AlAs, so the GaAs growth rate has decreased to 0.08 nm s$^{-1}$. Using this new GaAs growth rate, it is calculated that the thicknesses of the wells and barriers in the hotter region are reduced to 5 nm and 11 nm, respectively. The diffusion of Al into the wells also becomes more pronounced closer to the hotter region. The thinner barriers in this region are therefore probably not very high, relative to the AlGaAs wells, causing strong coupling. It should also be pointed out that this sample was the most extreme example of the process. Other samples which were grown with lower hotter-region temperatures, showed less shifts in exciton energies and good quality square-well photoluminescence from all regions.

Figure 4B:
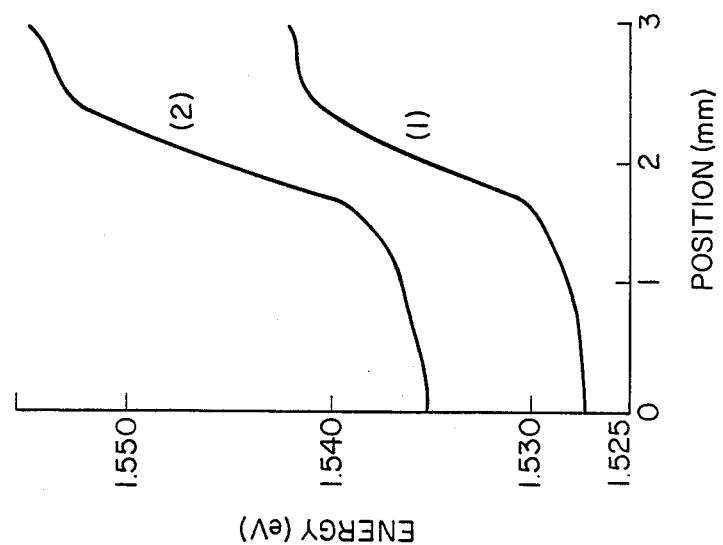
FIG. 4b is a plot of the energy shift in electron volts versus position in millimeters for the sample of FIG. 4a. NOTE: The length of the transition region can be varied by either changing the substrate mounting block temperature or the thickness of the substrate.
Figure 4A:
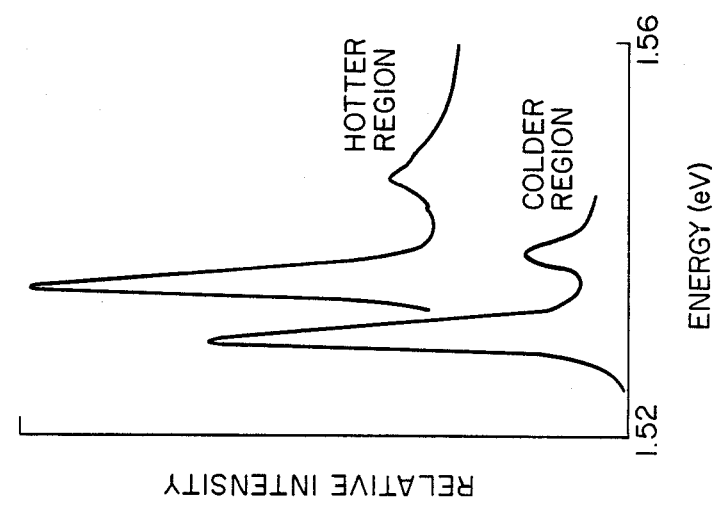
FIG. 4a is a plot of the spectra of the relative intensity versus energy in electron volts from the hotter and colder growth regions of a sample made with a 20 meV shift.

FIG. 4 shows spectra taken from a sample with a shift. In this sample, the temperature of the hotter region was about 700° C. and the data indicate that the thickness variation of the wells is dominant. With this method, peak energy shifts of 100 meV can be obtained before the Al diffusion becomes important. Hence, wells with either varied thickness, or varied thickness and Al diffusion, can be grown.

It is also noted that the integrated intensity of the various spectra in FIG. 2 are the same, within an order of magnitude, indicating that reasonable MBE growth conditions are realized over the full temperature range of the substrate. More can be done to optimize the growth conditions. The line widths of the peaks are approximately three times as wide and within an order of magnitude as intense as those from wells grown under optimum standard growth conditions in our laboratory. Tradeoffs between transition-region length and well-thickness differences can be made to optimize photoluminescence.

II. Tapered Waveguide

An alternative embodiment of the invention will now be described in connection with FIGS. 5–8. In this embodiment, the gradient temperature method of the invention will be used to form tapered $Al_xGa_{1-x}As$/GaAs waveguides WG to couple the laser output from an active laser layer 20″ to optical fibers F. In an article entitled "Constant-Width Variable-Index Transition For Efficient Ti:LiNbO$_3$ Waveguide-Fiber Coupling" by Suchoski, Jr., et al., which appeared in the *Journal of Lightwave Technology*, Vol. LT-5, No. 9, Sept. 1987, the authors indicate that there are many potential applications for tapered transitions in integrated optics. They further indicate that although numerous theoretical papers have been published on the topic, only a few experimental results have been reported.

Figure 5:
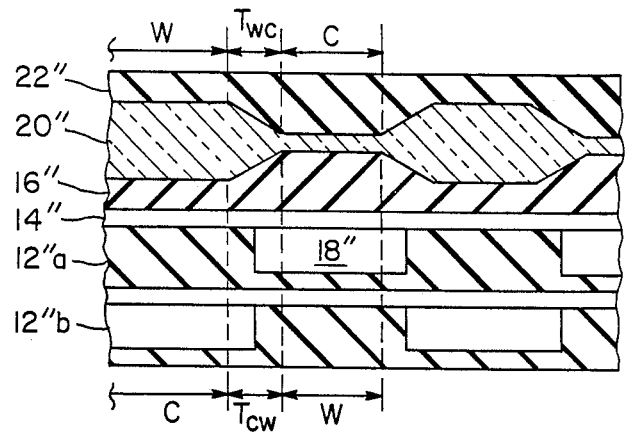
FIG. 5 is a schematic illustration of a molecular beam epitaxial process for growing guided channels with unguided regions using a gradient heating method of the invention.
Figure 6:
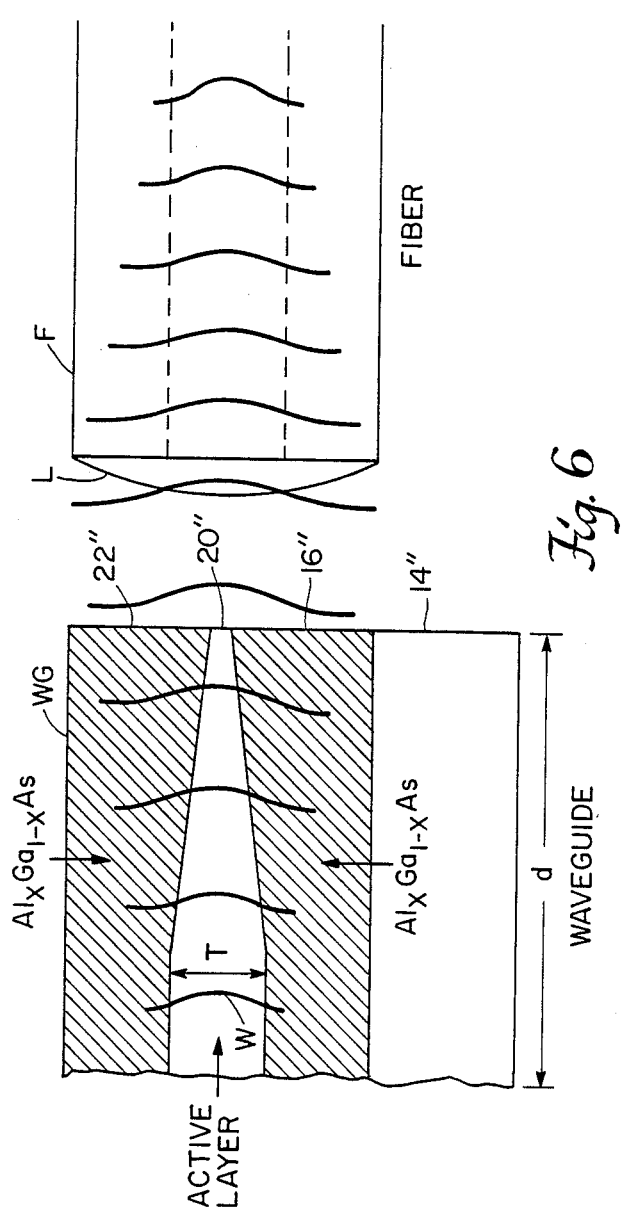
FIG. 6 is a schematic illustrating a method for forming tapered aluminum gallium arsenide/gallium arsenide waveguides for coupling-to-optical fibers.
Figure 7:
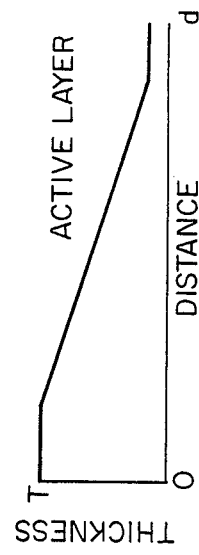
FIG. 7 is a plot of the variation of the ratio of aluminum arsenide content to gallium content of the active layer versus distance along the waveguide of FIG. 6.
Figure 8:
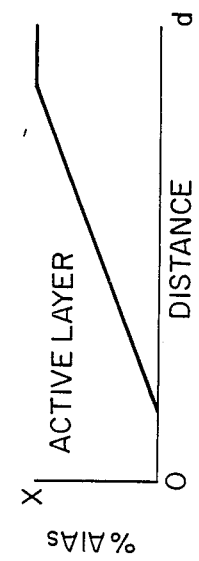
FIG. 8 is a plot of the thickness of the active layer t versus distance along the waveguide of FIG. 6

One particular promising application for tapered waveguides is the requirement to efficiently couple from an optical waveguide device to a fiber optic device. As shown in FIGS. 5–8, such efficient coupling may be achieved by forming an optical waveguide WG at one end of an active laser device in the form of complementary tapered upper and lower aluminum gallium arsenide cladding layers 22″ and 16″, respectively, with an active layer 20″ of gallium arsenide formed in.between the inclined walls of the cladding layers. As shown in FIGS. 5 and 6, such a device may be fabricated by forming the lower aluminum gallium arsenide layer 16" on a gallium arsenide substrate 14" in which a tapered heating gradient is provided, as previously described, utilizing a slotted heating block 12a". Slots 18" are formed in the heating block such that an upwardly inclined warm-to-cold transition region Twc is formed wherein the aluminum gallium arsenide layer 16" gradually becomes thicker and the gallium content becomes greater as the layer is subjected to a thermal transition from warmer region W to a region C of cooler temperature.

Next, the active layer 20" is formed using a different heating block 12"b, in which the location of the transition from warmer to colder, is opposite that of 12"b. This can also be accomplished of course by shifting the location of the wafer on the same mounting blocks 12"a. A thick active layer is initially formed with the thickness tapering off progressing along the distance d (see FIG. 8) and the percentage aluminum content x increasing along the distance d.

Next, the upper cladding layer is formed using the same configuration as the lower cladding layer, where the temperature zones are reversed from those of the active layer. The result of the three growths is to form the layer configuration of FIG. 6 when portions of the layers formed in FIG. 5 are cleaved-off at the interface between Twc and C. The result is that the end of the taper has the same Al content as the cladding layers 16" and 22" in that region.

Thus, as shown in FIG. 6, lightwaves W traveling down the guide become less confined in the taper. This occurs as the Al content of the layers becomes more equal and the active layer thickness decreases. The effect causes a divergence of the beam which can be controlled by the taper distance and Al content of the layers. With an appropriate design of the taper and Al content of the layers the divergence can be made to optically match the optical conditions needed to couple the radiation into an optical fiber F with little loss of radiation. In this regard the taper acts as a coupling lens to couple light optional lenslet L at the input to fiber F. This tapered coupling lens may thus be monolithically integrated in the waveguide.

III. Optical Antennas

The ability to grow layers of AlGaAs which very in thickness and Al content makes possible the fabrication of waveguides with integrated polyrod type antennas of the type described in "Polyrod Antennas", Bell System Tech. I. 26, 837 (1947), G. E. Mueller et al. With such technology, dense one and two-dimensional laser or waveguide arrays can be fabricated with the radiation pattern of each individual emitter designed to optimize the pattern of the whole array. In particular, each individual emitter can be constructed so that the coherent array would have near unity fill-factor over the array dimensions. The compositional variation of the Al increases the size of the guided wave in both transverse dimensions and thus this adaptation of the dielectric polyrod antenna of World War II, would have significant advantages for two-dimensional arrays.

Figure 9A:
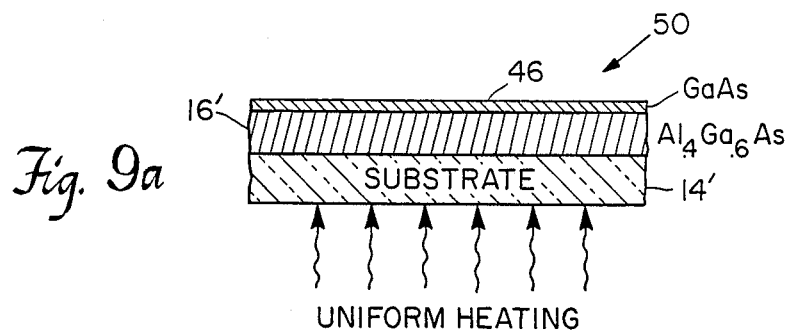
FIGS. 9a–9c illustrate a process of the invention for producing tapered antennas.
Figure 9B:
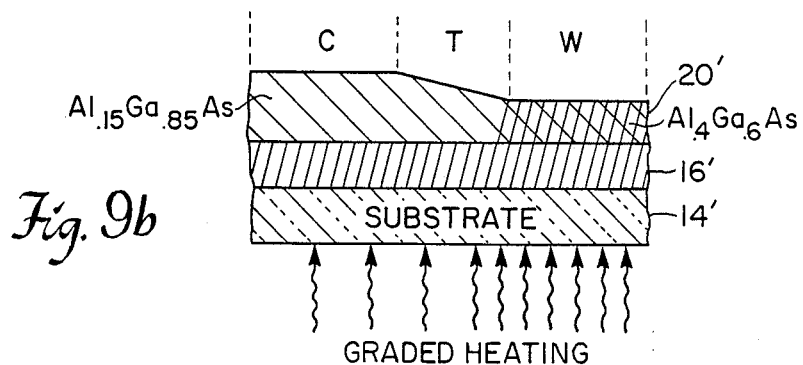
Figure 9C:
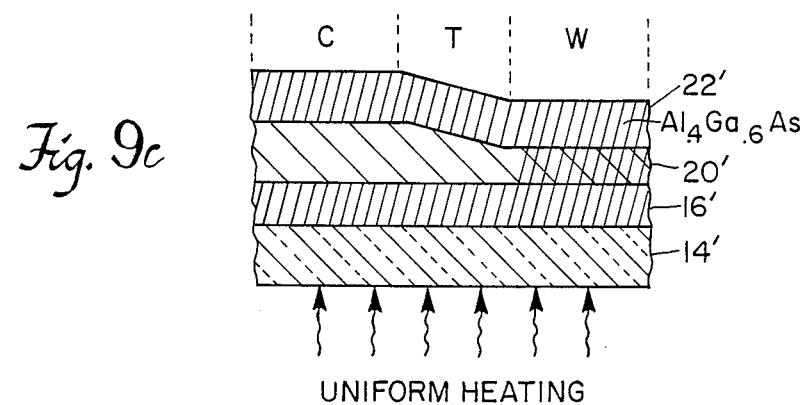

FIGS. 9a and 9c show how the process of the present invention can be adapted to produce the necessary tapers for antennas. In the first step, a lower $Al_xGa_{x+2}As$ cladded layer 16' and temporary 10 nm GaAs cap layer 46 are grown by MBE on a uniformly heated substrate 14'. Cap layer 46 is provided to protect the exposed surface of layer 16' from oxidation. The wafer 50 is removed from the MBE system and remounted with indium on a slotted block (as previously described). The wafer 50 is then reloaded in the MBE chamber and the GaAs cap layer 46 is removed with a thermal etching process. The guiding layer 20' is then grown with graded heating of the substrate. In the hotter regions W less Ga sticks to the wafer surface than in the colder regions C causing differences in layer thicknesses and Al content. In the example shown in FIG. 9b the Ga content in layer 20' in the cool region is 85%, whereas in the warm region it is 60% and the thickness of layer 20' is much greater in the cool region than in the warm region. This process is controlled by the mounting block temperature. A hotter block temperature causes a larger change in the Al content of the layer between the regions. The pattern in the mounting block, thickness of the substrate, and heat flow determine the pattern in the guiding layer. Another GaAs cap layer (not shown) at a low block temperature is grown to protect the layers during the remounting process; preparatory to the next step. After remounting on a uniformly heated block and removal of the cap layer, a top cladding layer 22' is then grown with uniform substrate heating with the same parameters as the lower cladding layer 16'. The region C of the guiding layer 20' forms a guide region for the antenna portion of layer 20' found in the warm region W.

Data from two preliminary growth runs shows a waveguide structure with distinct cladding and guiding layers. The hotter data shows that the guiding layer 20' became compositionally the same as the cladding layers 16' and 22', which eliminates the guiding and allows that portion of the guiding layer 20' to radiate in all directions. The transition distances T between W and C regions is between 1 and 2 mm with current growth procedures. In the second growth run the block temperature was significantly increased. Auger data from the second run shows that the guiding layer 20' in the hotter region W has significantly more Al than the lower and upper cladding layers 16' and 20', respectively, resulting in an antiguiding region. Thus, in this growth run, the length of the transition distance from the guided end to the point in the wafer where the Al content of the three layers is equal, would be much less than the 1 or 2 mm measured in the above sample. Control of the taper dimensions is therefore easily obtained through the mounting block temperature. Where highly symmetric patterns are required physical tapers may be formed in the planar direction on devices made as above as the heating may be graded in two dimensions. Physical tapering may be accomplished by lithography, etching or regrowth.

IV. Two-Dimensional Laser Array With Lasers of Four Independent Wavelengths

Figure 10:
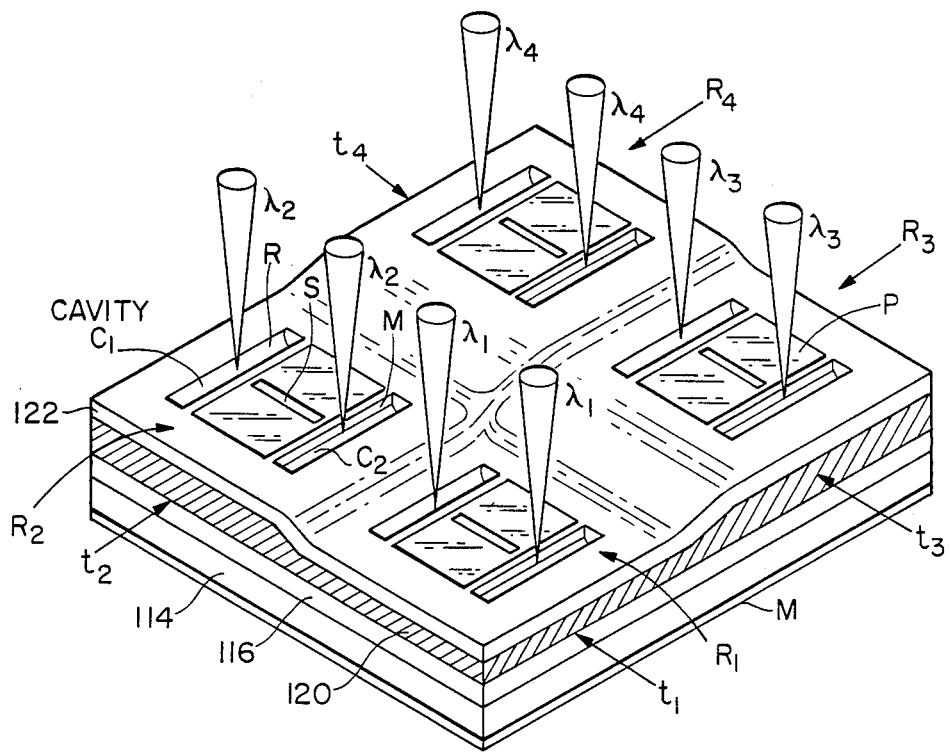
Fig 10 is a schematicized perspective of a two dimensional laser array with lasers of four independent wavelengths fabricated in accordance with the method of the invention.

Referring now to FIG. 10, another embodiment of the invention will be described in connection therewith. In this embodiment, the method of the invention is used to form a plurality of lasers on a single substrate. Each laser has a different wavelength λ which is dependent on the thickness of the quantum-well layer 120 formed on the substrate 114.

In the embodiment of FIG. 10, a buffer layer 116 of aluminum gallium arsenide, preferably n-type aluminum gallium arsenide of about 40% aluminum content, is formed by MBE or MOCVD on a gallium arsenide substrate 114 using uniform heating of the substrate, as previously described in connection with FIG. 1. Similarly, active layers of quantum-well gallium arsenide and aluminum gallium arsenide 120 are formed over the aluminum gallium arsenide layer 116, using the process described in FIG. 1, wherein the thickness t of the active regions of the layers 120 are varied by varying the gradient heating. In this embodiment heating is graduated in two dimensions of the substrate region.

In regions $R_1$, $R_2$, $R_3$, $R_4$, the thicknesses are respectively $t_1$, $t_2$, $t_3$, $t_4$. Thus, the wavelengths of the light emitted from lasers formed in the regions, will correspond to the respective thicknesses. In the example given in FIG. 9, $\lambda_1$ is less than $\lambda_2$ is less than $\lambda_3$ is less than $\lambda_4$, since $t_1$ is less than $t$, which is less than $t_3$ and less than $t_4$. A cladding layer 122 of aluminum gallium arsenide of about 40% aluminum of n-type doping is formed by MBE over the active layer 120. Cavities C1 and C2 are formed in each of the regions adjacent the active strip S of each laser. Contact metallization for contact pads P and back contact B are then formed by evaporation.

Partly transparent mirror surfaces M are formed in each cavity adjacent the edge of the strip S and reflective mirror surface R is formed adjacent the transparent mirror surface M to transform the edge emitting laser to a surface emitting laser. These cavities and mirror surface may be formed in accordance with U.S. Pat. No. 4,718,070 issued Jan. 5, 1988 (incorporated herein by reference), or may be fabricated using angled chlorine ion beam assisted etching, as described in the Institute of Physics Conference Series 83, W. T. Lindley ed., (IOP Publishing Ltd. Bristol), pages 349-354 entitled "Angular Chlorine Ion-Beam-Assisted Etching of GaAs and AlGaAs" by W. D. Goodhue et al., also incorporated herein by reference.

V. Multiplexing Lasers of Different Wavelengths Into One Waveguide

Figure 11:
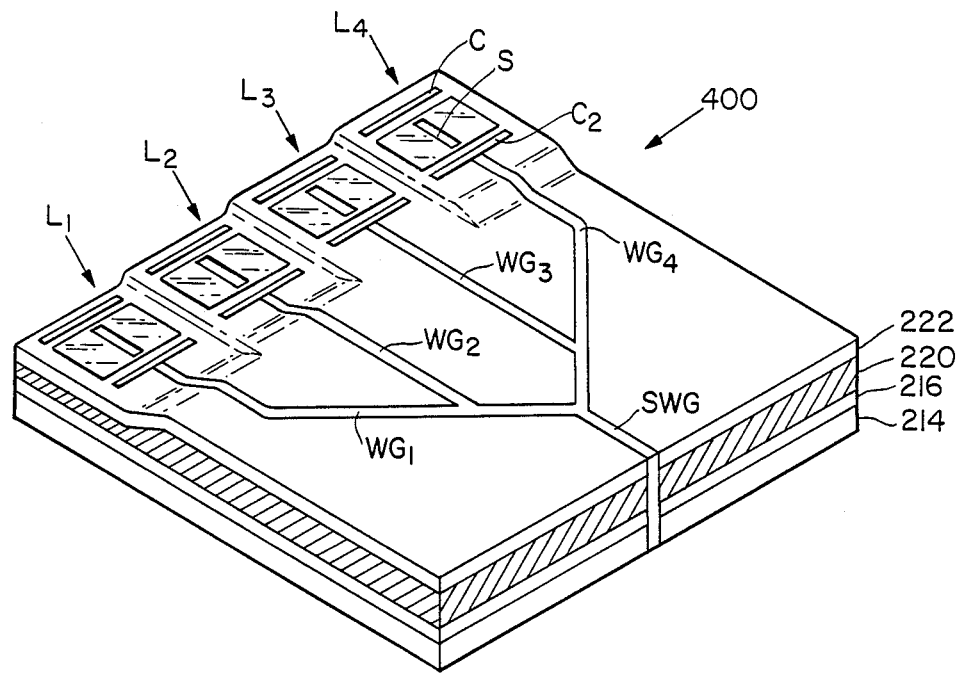
FIG 11 is a schematicized perspective of a device for multiplexing different wavelength lasers into one waveguide, in accordance with the method of the invention.

In the embodiment shown in FIG. 11, four lasers L1-L4 are fabricated, as described in connection with FIG. 10, except for the surface emitting cavity portions. The lasers are formed with different thicknesses of active regions 220 on an underlying aluminum gallium arsenide cladding layer 216 formed on a gallium arsenide substrate 214. An upper cladding layer 222 of aluminum gallium arsenide is formed over the active quantum well layer(s) 220. Because of the different thicknesses of the active layer(s) each laser emits light at the edge of the active strips S into a cavity C at a different wavelength $\lambda_1$-$\lambda_4$. Also the light is emitted at a different level in the plane of the structure with the higher wavelength laser L4 being at the higher plane. Thus, to multiplex these laser sources; transition regions of complementary slope are required to form waveguides to couple the active edge of a laser structure to the same plane of the chip 400 as the other waveguides. In accordance with the invention, this is conveniently accomplished as described in connection with FIG. 6 by varying the thickness of the active region adjacent the laser cavity section using gradient heating, so that, for example, the thickness of the transition region adjacent L4 is gradually decreased, while the thickness adjacent the L3 device is maintained uniform, until the mid-line of the waveguide section WG4 of the $\lambda_4$ device is on the same plane as the waveguide section WG3 of the $\lambda_3$ device.

Corresponding transitions are made for waveguides WG2 and waveguides WG1, until all waveguides are on the same plane. Then the waveguides are joined by "Y-GUIDES" which combine the radiation from the lasers L1-L4 into a single waveguide SWG. The end of the single waveguide may be fabricated using the invention into a taper for coupling either to an optical fiber or into free space, as described above in connection with Figs. 9a-9c. Vertical guiding is accomplished as previously described by changing the Al content versus the Ga content in the upper and lower cladding layers in accordance with the invention. Lateral guiding may also be accomplished by two-dimensional gradient heating but may also be achieved in the conventional manner by damaging the active area on each lateral side by ion implantation or other well known techniques.

To demonstrate that lasers of different wavelengths can be monolithically integrated as described above; the following epitaxial layers were grown on a $p^+$-GaAs substrate; a high-Al-content p-AlGaAs cladding layer, a low-Al content undoped AlGaAs layer, five GaAs active wells with undoped AlGaAs barriers, a low-Al-content undoped AlGaAs layer, a high-Al-content n-AlGaAs cladding layer, and an n-GaAs contacting layer. During the entire growth process the substrate was mounted with indium on a slotted MBE mounting block to create zones of two different temperatures at the surface of the substrate. With the growth temperature of the block set at 720° C., the surface temperature of the substrate over the indium contacted regions was 720° C. and over the uncontacted regions was 680° C. The MBE shutters were timed to give nominal well and barrier thicknesses of 10 m and 20 nm respectively at 680° C.

Broad-area lasers were fabricated and cleaved from both the hotter and colder surface temperature growth regions of the wafer. Lasers in the colder region had threshold current densities around 0.9 KA cm$^{-2}$ differential quantum efficiencies of 15% per facet, and wavelengths around 865 nm; while lasers in the hotter region had threshold current densities around 1.5 KA cm$^{-2}$, differential quantum efficiencies of 7% per facet and wavelengths around 825 nm. No attempt was made to optimize the growth conditions with regard to threshold current density.

Equivalents

This completes the description of the preferred embodiments of the invention. Those skilled in the art may recognize other equivalent embodiments to those described herein; which equivalents are intended to be encompassed by the claims attached hereto. For example, MBE has been used as the preferred process of choice for growing the layers. With suitable heaters, it is contemplated that those skilled in the art will be able to implement the invention without undue experimentation in MOCVD and CBE reactors.

I claim:

1. A method for forming regions of varying thickness of Group III-V material compound layers and varying ratio of the Group III materials relative to each other in the compound layers to produce compound semiconductor layers with varying bandgap on a substrate comprising the steps of:
   (a) providing a substrate in an epitaxial growth chamber;
   (b) bringing the substrate to a first warmer growth temperature in one region of the substrate and to a second cooler growth temperature in another region of the substrate;
   (c) introducing at least two Group III semiconductor materials and a Group V semiconductor material into the chamber and growing said materials over said substrate, such that a compound III-V material layer is formed over the substrate which layer varies in thickness from one region to another in accordance with the sticking coefficients of the Group III materials some of which sticking coefficients are lower at a higher temperature and because of this the thickness of the compound layer is greater over the region of the lower temperature than in the region of the warmer temperature and the content of the Group III material with the lower sticking coefficient at higher temperature is greater over the region of the lower temperature than in the region of the warmer temperature to produce a change in bandgap of the compound III-V material layer across the layer in accordance with the temperature change in the different regions of the substrate.

2. The method of claim 1 wherein the Group III materials are taken from the group comprising gallium or indium or aluminum and the Group v material is arsenic and the change in the amount of indium relative to gallium relative to aluminum is greater over the colder region as compared to the hotter region.

3. The method of claim 1 wherein the chamber is an MBE chamber and the Group III and Group V material is introduced as a flux.

4. The method of claim 3 wherein the Group III material is gallium and the Group V material is arsenic and the first and second temperatures are in the range of 680-800 degrees centigrade.

5. The method of claim 4 wherein the first warmer temperature is about 30.50 degrees centrigrade higher than the second cooler temperature.

6. The method of claim 4 wherein a flux of aluminum is also introduced into the chamber and an aluminum alloy of gallium arsenide material layer is formed.

7. A method for forming regions of varying thickness of GaAs compound layers comprising the steps of:
(a) providing a substrate in an a molecular beam epitaxial chamber;
(b) bringing the substrate to a high temperature in one region on the substrate and to a lower temperature in another region of the substrate;
(c) introducing a flux of Ga material and a flux of As material into said chamber and growing said materials over said substrate, such that a Ga As material layer is formed over the substrate which layer varies in thickness in accordance with the sticking coefficient of the Ga and wherein the thickness is greater over the region of the cooler temperature than in the region of the warmer temperature.

8. The method of claim 1 wherein a transition region is formed between cooler and warmer regions wherein the thickness of material layer increases in a direction proceeding from the warmer region to the cooler region.

9. The method of claim 8 wherein an aluminum alloy of III-V compound material layer is formed by introducing aluminum along with the III-V material in step (c).

10. The method of forming optical guiding channels with unguided regions comprising the steps of:
(a) forming a first cladding layer of cladding material formed of a III-V alloy of GaAlAs on a suitable substrate;
(b) heating the substrate to form growth temperature regions of higher temperature separated from growth temperature regions of lower temperature by a transition growth temperature region in which the temperature gradually decreases to said lower temperature;
(c) growing an updoped III-V layer of a III-V alloy on said first cladding layer by introducing group III elements, aluminum, and gallium, along with a group V element, arsenic, into a chamber with said heated substrate such that in the region of the lower temperature the III-V layer is thicker and of lower bandgap than in the region of higher temperature; and
(d) forming a second cladding layer as in (a) over the layer formed in step (c).

11. A method of forming an optical antenna comprising the steps of:
(a) forming a first aluminum gallium arsenide cladding layer on a uniformly heated substrate;
(b) forming an aluminum gallium arsenide guiding layer on said first cladding layer while said substrate is heated non-uniformly with a gradient thermal profile causing a transition region in said guiding layer wherein the thickness and gallium content of the guiding layer gradually changes in accordance with the thermal profile.

12. The method of claim 11 wherein a second cladding layer is formed on the guiding layer.

* * * * *

UNITED STATES PATENT AND TRADEMARK OFFICE
CERTIFICATE OF CORRECTION

PATENT NO. : 4,855,255
DATED : Aug. 8, 1989
INVENTOR(S) : William D. Goodhue

It is certified that error appears in the above-identified patent and that said Letters Patent is hereby corrected as shown below:

Column 11, line 20, "Group v" should be ---Group V---.

Column 11, line 32, "30.50" should be ---30-50---.

Column 11, line 42, "on" should be ---of---.

Column 11, line 46, "Ga As" should be ---GaAs---.

Signed and Sealed this

Third Day of April, 1990

Attest:

HARRY F. MANBECK, JR.

*Attesting Officer*  *Commissioner of Patents and Trademarks*